(12) United States Patent
Bencher et al.

(10) Patent No.: US 10,394,130 B2
(45) Date of Patent: Aug. 27, 2019

(54) QUARTER WAVE LIGHT SPLITTING

(71) Applicant: Applied Materials, Inc., Santa Clara, CA (US)

(72) Inventors: Christopher Dennis Bencher, Cupertino, CA (US); Joseph R. Johnson, Redwood City, CA (US); Dave Markle, Pleasanton, CA (US); Mehdi Vaez-Iravani, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/207,991

(22) Filed: Jul. 12, 2016

(65) Prior Publication Data

US 2017/0017165 A1    Jan. 19, 2017

Related U.S. Application Data

(60) Provisional application No. 62/191,915, filed on Jul. 13, 2015.

(51) Int. Cl.
*G03F 7/20* (2006.01)
*G02B 27/28* (2006.01)
(Continued)

(52) U.S. Cl.
CPC ....... *G03F 7/70291* (2013.01); *G02B 27/283* (2013.01); *G03F 7/2008* (2013.01); *G03F 7/2057* (2013.01); *G03F 7/70566* (2013.01); *G02B 5/3083* (2013.01); *G02B 26/0833* (2013.01); *G02F 1/1303* (2013.01)

(58) Field of Classification Search
CPC ............ G02B 26/0833; G03F 7/70291; G03F 7/70566
See application file for complete search history.

(56) References Cited

U.S. PATENT DOCUMENTS 5,539,568 A * 7/1996 Lin .................. G02B 26/06
                                                    355/53
6,582,080 B2   6/2003 Gibbon et al.
(Continued)

FOREIGN PATENT DOCUMENTS

CN    101568884 A    10/2009
CN    102713761 A    10/2012
(Continued)

OTHER PUBLICATIONS

PCT International Search Report and Written Opinion dated Oct. 12, 2016, for International Application No. PCT/US2016/040178.
(Continued)

*Primary Examiner* — Steven Whitesell Gordon
(74) *Attorney, Agent, or Firm* — Patterson + Sheridan LLP

(57) ABSTRACT

The present disclosure provides a method for producing an image on a substrate. The method includes providing a single beam of light to a multiple DMD assembly, splitting the single beam of light into an s-polarization beam and a p-polarization beam, and reflecting the s-polarization beam and the p-polarization beam through the multiple DMD assembly such that the multiple DMD assembly produces a plurality of superimposed images on the substrate.

19 Claims, 10 Drawing Sheets

(51) Int. Cl.
*G02B 26/08* (2006.01)
*G02B 5/30* (2006.01)
*G02F 1/13* (2006.01)

(56) References Cited

U.S. PATENT DOCUMENTS

| | | | | |
|---|---|---|---|---|
| 7,227,613 | B2* | 6/2007 | Ryzhikov | G03F 7/70225 |
| | | | | 355/53 |
| 2002/0003659 | A1 | 1/2002 | Marcellin-Dibon | |
| 2004/0053148 | A1* | 3/2004 | Morohoshi | G03F 7/70133 |
| | | | | 430/30 |
| 2004/0130561 | A1 | 7/2004 | Jain | |
| 2006/0072094 | A1* | 4/2006 | Honda | G03F 7/70291 |
| | | | | 355/67 |
| 2008/0210888 | A1* | 9/2008 | Inoue | G03F 7/70225 |
| | | | | 250/492.22 |
| 2008/0304030 | A1* | 12/2008 | Lous | G03F 7/70283 |
| | | | | 355/53 |
| 2009/0059197 | A1* | 3/2009 | Nam | G03F 7/70116 |
| | | | | 355/71 |
| 2009/0109417 | A1* | 4/2009 | Tanitsu | G02B 27/0927 |
| | | | | 355/67 |
| 2010/0097594 | A1* | 4/2010 | Cho | B01J 19/0046 |
| | | | | 355/71 |
| 2010/0321657 | A1* | 12/2010 | Van Schoot | G03F 7/70208 |
| | | | | 355/55 |
| 2014/0118711 | A1* | 5/2014 | Werschnik | G02B 26/0841 |
| | | | | 355/67 |
| 2015/0015859 | A1 | 1/2015 | Yun et al. | |
| 2015/0192859 | A1 | 7/2015 | Tanitsu | |

FOREIGN PATENT DOCUMENTS

JP 2003195475 A 7/2003
TW 201525619 A 7/2015

OTHER PUBLICATIONS

Taiwan Office Action dated Mar. 18, 2019 for Application No. 105121377.

* cited by examiner

QUARTER WAVE LIGHT SPLITTING

CROSS-REFERENCE TO RELATED APPLICATIONS

This application claims priority from U.S. Provisional Application Ser. No. 62/191,915, filed Jul. 13, 2015, which is hereby incorporated by reference in its entirety.

BACKGROUND

Field

Embodiments of the present disclosure generally relate to methods for producing an image on a substrate, and more particularly to methods for producing an image on a substrate having twice the number of pixels as a conventional method.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices to consumers at the prices demanded by consumers, new apparatuses, approaches, and systems are needed to precisely and cost-effectively create patterns on substrates, such as large area substrates.

As the foregoing illustrates, there is a continual need for an improved technique for precisely and cost-effectively creating patterns on a substrate.

SUMMARY

In one embodiment, a method for producing an image on a substrate is disclosed herein. The method includes providing a single beam of light to a multiple digital micromirror device (DMD) assembly, splitting the single beam of light into an s-polarization beam and a p-polarization beam, and reflecting the s-polarization beam and the p-polarization beam through the multiple DMD assembly such that the multiple DMD assembly produces a plurality of superimposed images on the substrate.

In another embodiment, a method for producing an image on a substrate is disclosed herein. The method includes providing a p-polarization beam to a first mirror cube having a first DMD, providing an s-polarization beam to a second mirror cube having a second DMD, and reflecting the p-polarization beam off the first DMD and reflecting the s-polarization beam off the second DMD such that the p-polarization beam and the s-polarization beam are reflected towards a light altering device configured to produce a plurality of superimposed images on the substrate.

In one embodiment, an image projection system is disclosed herein. The image projection system includes at least one light source and a multiple DMD assembly. The multiple DMD assembly is configured to product a plurality of superimposed images from the light source. The multiple DMD assembly includes a plurality of DMDs and a light altering device configured to alter the light provided from the light source.

DETAILED DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the present disclosure generally relate . . .

Figure 1:
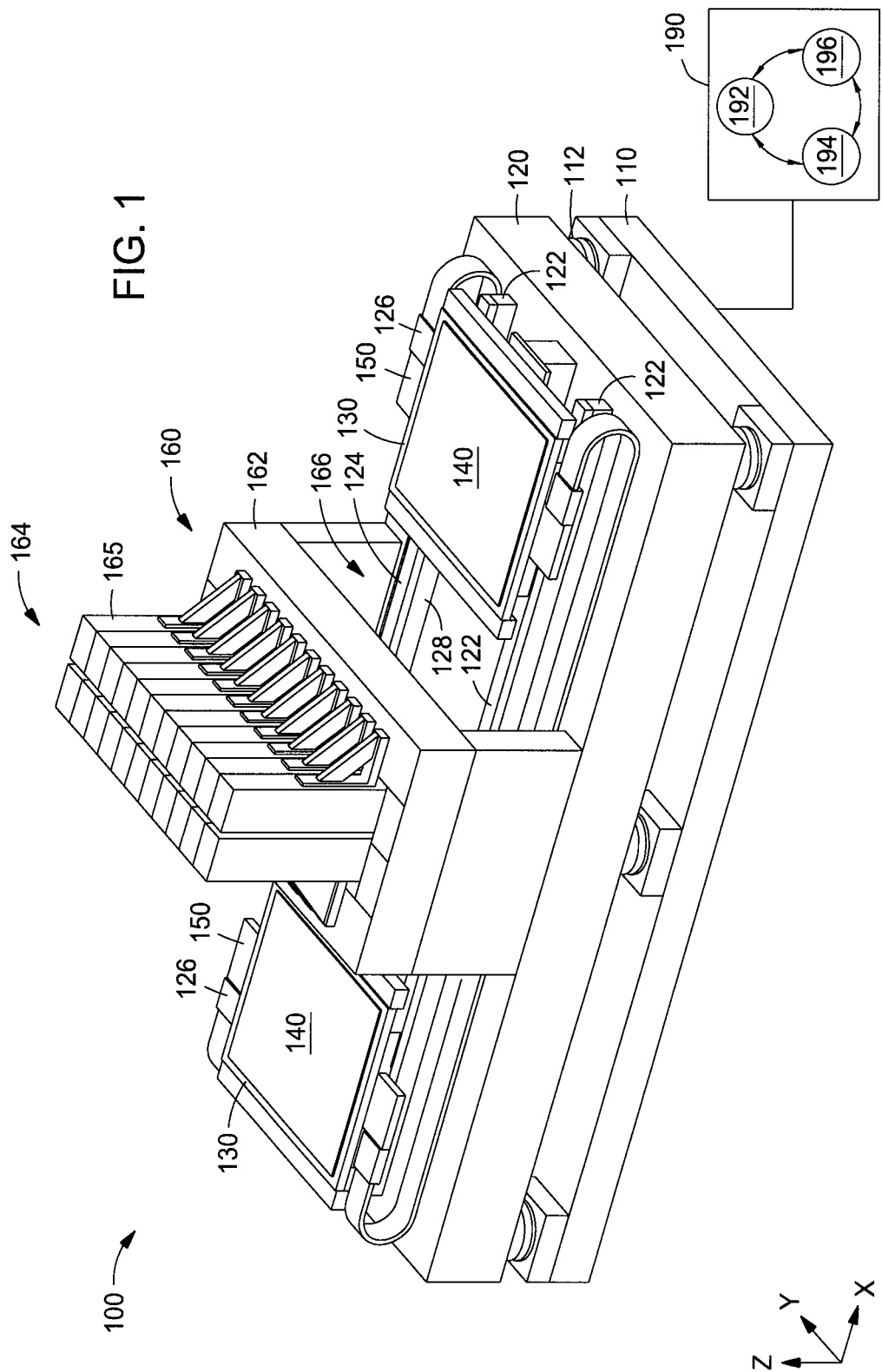
FIG. 1 illustrates a perspective view of a processing system, according to one embodiment.

FIG. 1 is a perspective view of a system 100 that may benefit from embodiments disclosed herein. The system 100 includes a base frame 110, a slab 120, two or more stages 130, and a processing apparatus 160. The base frame 110 may rest on the floor of a fabrication facility and may support the slab 120. Passive air isolators 112 may be positioned between the base frame 110 and the slab 120 to reduce transmissions of vibrations therebetween. The slab 120 may be a monolithic piece of granite, and the two or more stages 130 may be disposed on the slab 120. A substrate 140 may be supported by each of the two or more stages 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter lower the substrate 140 onto the stage 130.

The substrate 140 may, for example, be made of quartz and be used as part of a flat panel display. In some embodiments, the substrate 140 may be made of other materials. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or a negative photoresist. For example, the photoresist may include at least one of diazonaphthoquinone, a phenol formaldehyde resin, poly (methyl methacrylate), poly(methyl glutarimide), and SU-8. The pattern of the photoresist may be transferred to a surface of the substrate 140 to form the electronic circuitry.

The processing system 100 may further include a pair of supports 122 and a pair of rails 124. The pair of supports 122 may be disposed on the slab 120. The slab 120 and the pair of supports 122 may be a single piece of material. The pair of rails 124 may be supported by the pair of supports 122. The two or more stages 130 may move along the rails 124 in the x-direction. In one embodiment, the pair of rails 124 is linear. In other embodiments, the track 124 may have a non-linear shape. An encoder 126 may be coupled to each stage 130 or rail 124 in order to provide information to a controller (not shown) of the position of the stage 130 relative to the rail 124.

The processing apparatus 160 may include a support 162 and a processing unit 164. The support 162 may be disposed on the slab 120. The support 162 may include an opening 166 for the two or more stages 130 to pass under the processing unit 164. The processing unit 164 may be supported by the support 162. In one embodiment, the processing unit 164 is a pattern generator configured to expose a photoresist disposed on the substrate 140 using a photolithography process. In some embodiments, the pattern generator may be configured to perform a maskless lithography process. The processing unit 164 may include a plurality of image projection systems (shown in FIG. 3) disposed in a case 165. The processing apparatus 160 may be utilized to perform maskless direct patterning. During operation, one of the two or more stages 130 moves in the x-direction from a loading position, as shown in FIG. 1, to a processing position below the processing unit 164. The stages 130 may be lifted by a plurality of air bearings 202 (shown in FIG. 2) when moving along the pair of rails 124. A plurality of vertical guide air bearings (not shown) may be coupled to each stage 130 and positioned adjacent an inner wall 128 of each support 122 in order to stabilize the movement of the stage 130. A track 150 may be disposed between stages 130 and the rails 124 so that the stages 130 may also be moved in the y-direction along the track 150 for processing and/or indexing the substrate 140, particularly below the processing unit 164 while processing the substrate 140.

Figure 2:
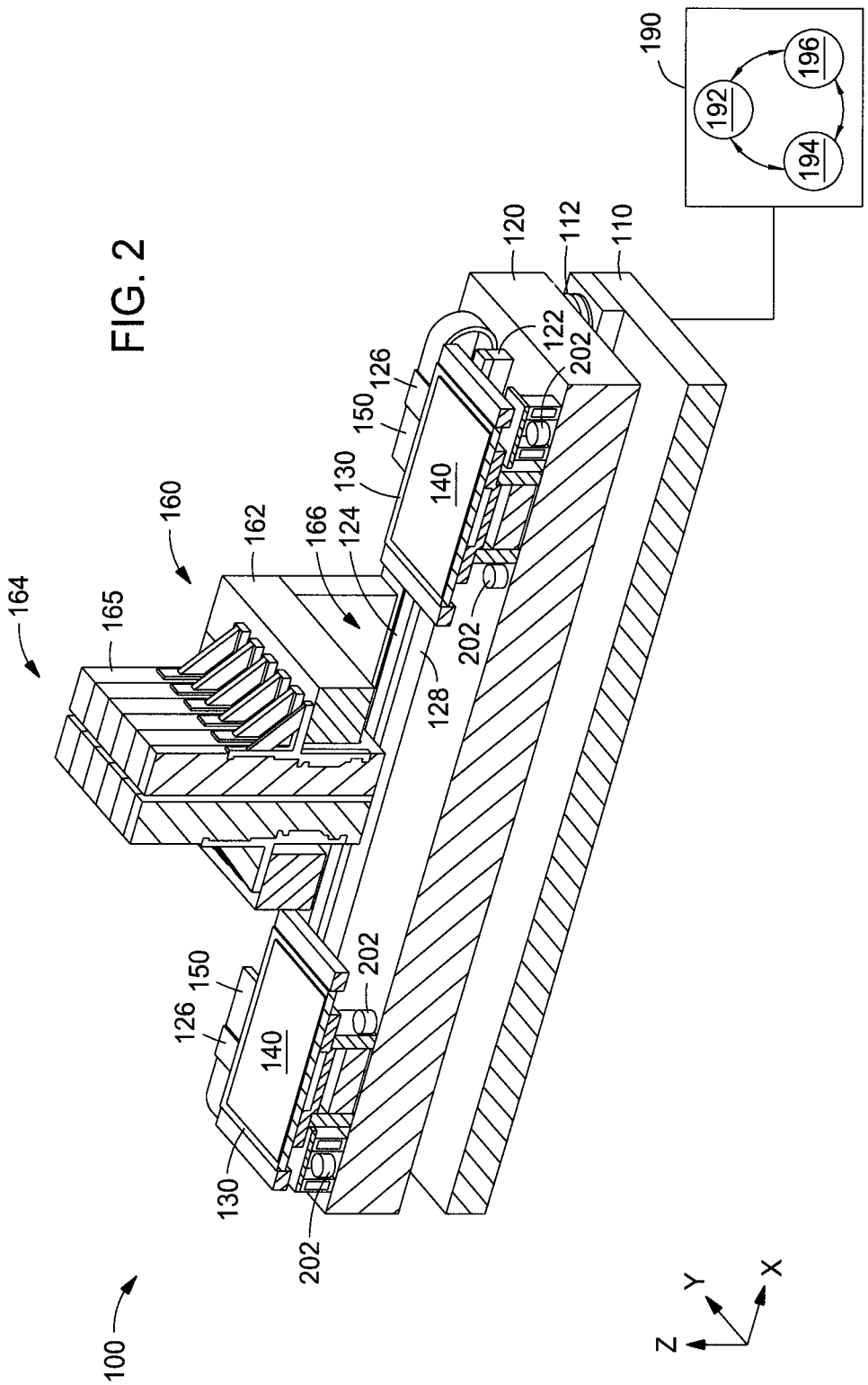
FIG. 2 illustrates a cross-sectional side view of the processing system of FIG. 1, according to one embodiment.

FIG. 2 is a cross-sectional side view of the processing system 100 of FIG. 1, according to one embodiment. As discussed above, each stage 130 includes a plurality of air bearings 202 for lifting the stage 130. Each stage 130 may also include an actuator, such as a motor, for moving the stage 130 along the rails 124. The two or more stages 130 and the processing apparatus 160 may be enclosed by an enclosure (not shown) in order to provide temperature and pressure control.

The system 100 also includes a controller 190. The controller 190 is generally designed to facilitate the control and automation of the processing techniques described herein. The controller 190 may be coupled to or in communication with one or more of the processing apparatus 160, the stages 130, and the encoder 126. The processing apparatus 160 and the stages 130 may provide information to the controller 190 regarding the substrate processing and the substrate aligning. For example, the processing apparatus 160 may provide information to the controller 190 to alert the controller 190 that substrate processing has been completed.

The controller 190 may include a central processing unit (CPU) 192, memory 194, and support circuits (or I/O) 196. The CPU may be one of any form of computer processors that are used in industrial settings for controlling various processes and hardware (e.g., pattern generators, motors, and other hardware) and monitor the processes (e.g., processing time and substrate position). The memory 194 is connected to the CPU 192, and may be one or more of a readily available memory, such as random access memory (RAM), read only memory (ROM), floppy disk, hard disk, or any other form of digital storage, local or remote. Software instructions and data can be coded and stored within the memory 194 for instructing the CPU 192. The support circuits 196 are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position.

Figure 3:
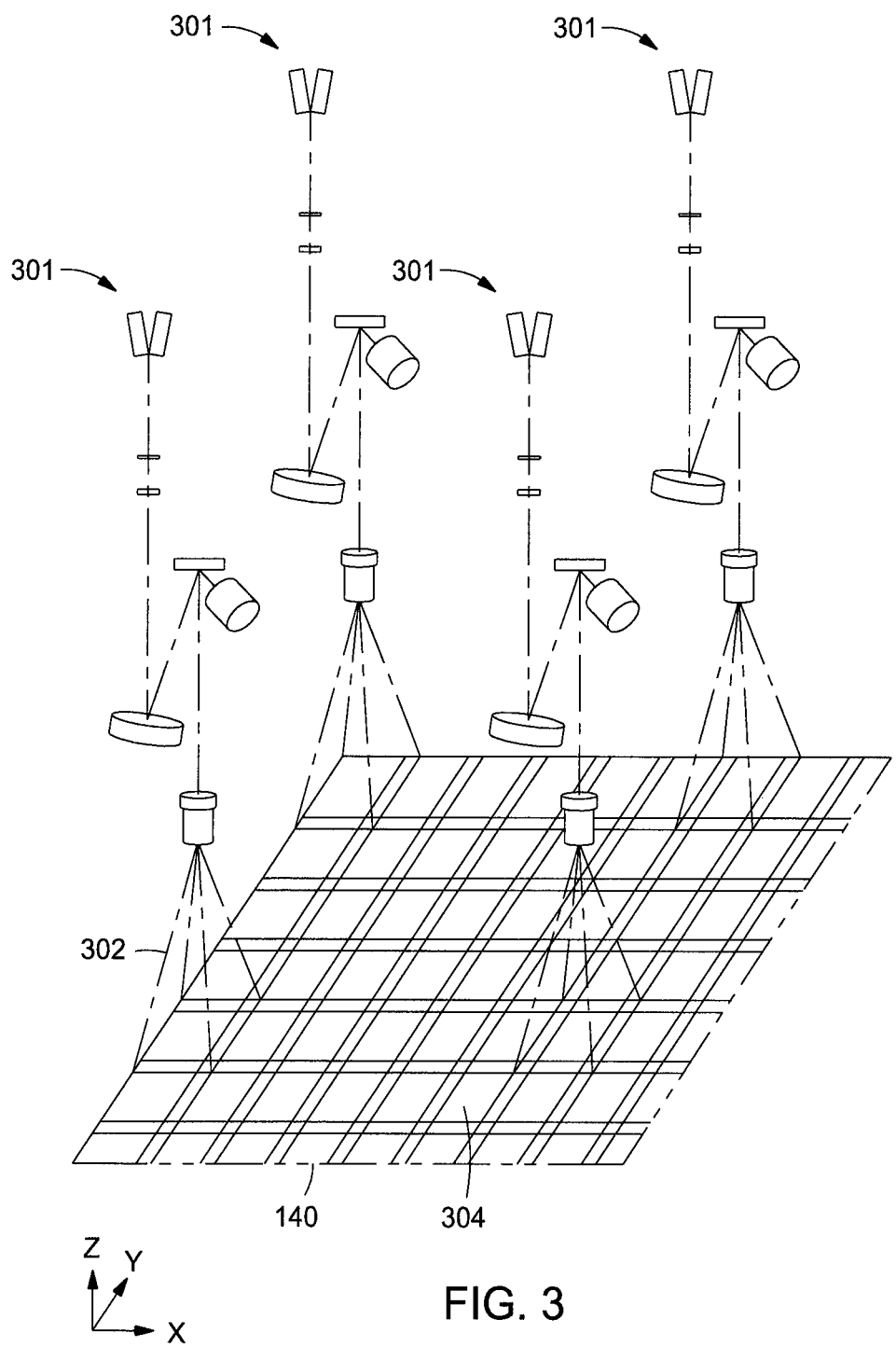
FIG. 3 illustrates a perspective view of a plurality of image projection systems, according to one embodiment.

FIG. 3 is a perspective view of a plurality of image projection systems 301 according to one embodiment. As shown in FIG. 3, each image projection system 301 produces a plurality of write beams 302 onto a surface 304 of the substrate 140. As the substrate 140 moves in the x-direction and the y-direction, the entire surface 304 may be patterned by the write beams 302. The number of image projection systems 301 may vary based on the size of the substrate 140 and/or the speed of the stage 130.

Figure 4:
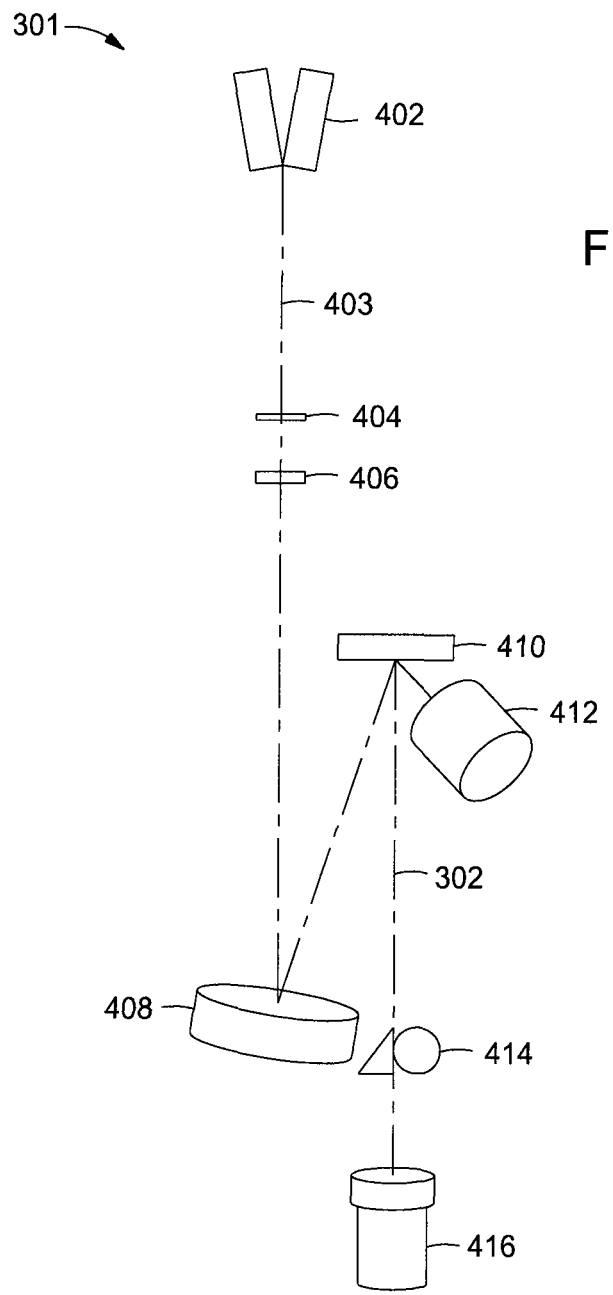
FIG. 4 illustrates a perspective schematic view of one image projection system of the plurality of image projection systems of FIG. 3.

FIG. 4 is a perspective schematic view of one image projection system 301 of the plurality of image projection systems 301 of FIG. 3 according to one embodiment. The image projection system 301 may one or more light sources 402, an aperture 404, a lens 406, a mirror 408, multiple digital micromirror device (DMD) assembly 410, a light dump 412, a camera 414, and a projection lens 416. The light source 402 may be an LED or a laser. The light source 402 may be capable of producing a light having a predetermined wavelength. In one embodiment, the predetermined wavelength is in the blue or near ultraviolet (UV) range, such as less than about 450 nm. The mirror 408 may be a spherical or other suitable mirror. The projection lens 416 may be a 10× objective lens. The projection lens 416 may alternatively have other magnification.

During operation, a beam 403 having a predetermined wavelength, such as a wavelength in the blue range, is produced by the light source 402. The beam 403 is reflected to the multiple DMD assembly 410 by the mirror 408. The DMD assembly 410 forms a plurality of write beams 302, and reflects the plurality of write beams 302 to the surface 304 of the substrate. The plurality of write beams 302 patterns the surface of the substrate by exposing areas of the substrate. Pixels (not shown) are formed in the exposed areas. The multiple DMD assembly 410 is configured to double the number of pixels formed by the write beams 302 provided to the surface 304 of the substrate compared to the number of pixels provided from a conventional image projection device with a single DMD because the number of write beams provided by the multiple DMD assembly 410 is greater than the number of write beams produced by a single DMD.

Figure 5:
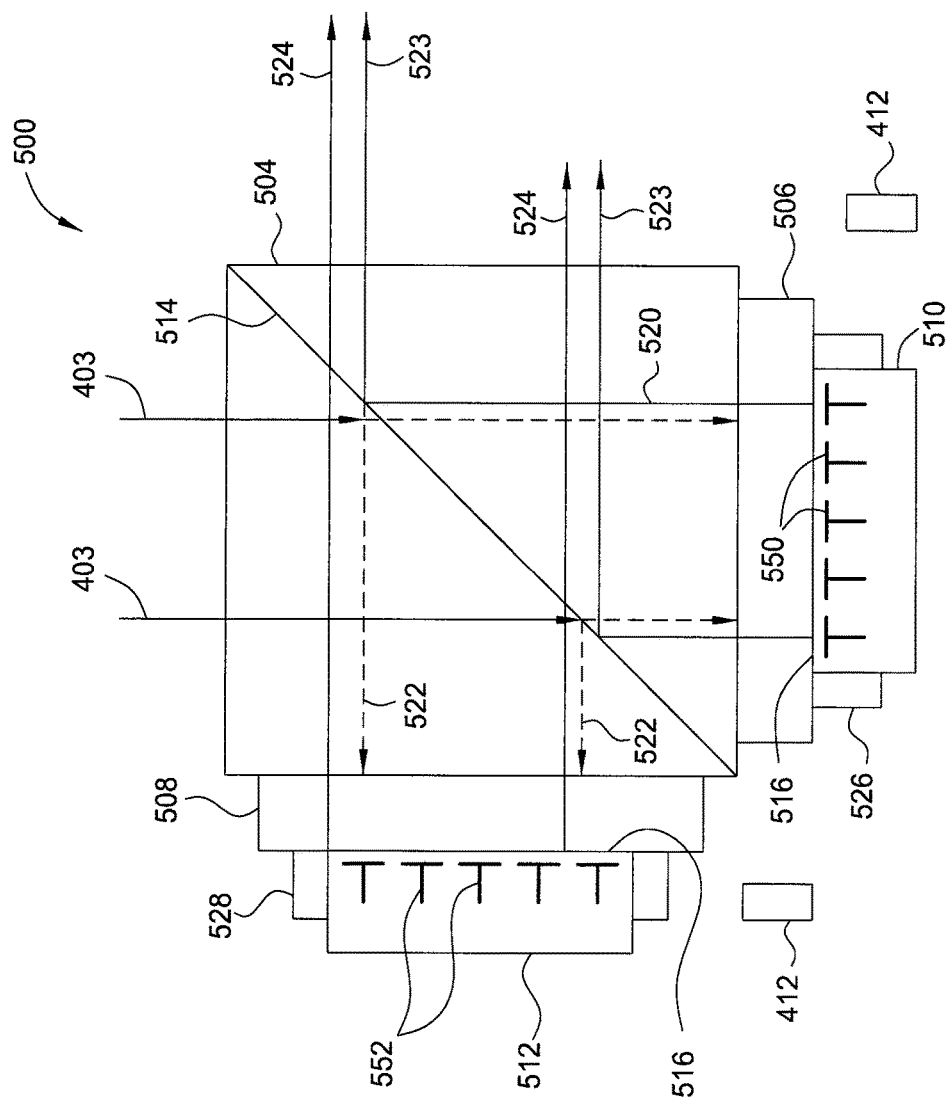
FIG. 5 illustrates a perspective view of a multiple DMD assembly, according to one embodiment.

FIG. 5 is a perspective view a multiple DMD assembly 500 which may be the same as the multiple DMD assembly 410 (depicted in FIG. 4), according to one embodiment. The multiple DMD assembly 500 may include one or more polarizing beam splitting cubes 504, a plurality of quarter wave plates 506, 508, and a plurality of DMDs 510, 512. The polarizing beam splitting cube 504 includes a light altering device 514 and a plurality of openings 516. In the embodiment shown in FIG. 5, the light altering device 514 is an interface 514. For example, the interface 514 may be in the form of a diagonal prism frame. The polarizing beam splitting cube 504 is configured to split incoming light 403 from the light source 402 into an s-polarization beam 520 and a p-polarization beam 522. The incoming light 403 is transmitted to the diagonal prism frame 514. The diagonal prism frame 514 splits the incoming light 403 into the s-polarization beam 520 that is transmitted through the diagonal prism frame 514 and the p-polarization beam 522 that is reflected off the diagonal prism frame 514.

The first quarter phase plate 506 is disposed in one of the openings 516 of the polarizing beam splitting cube 504. The s-polarization beam 520 passes through the first quarter phase plate 506. The first quarter phase plate 506 is configured to change the polarization of the s-polarization beam 520 by a quarter phase. The first DMD 510 is disposed opposite the first quarter phase plate 506. The first DMD 510 includes a plurality of mirrors 550. The number of mirrors 550 may correspond to the resolution of the resolution of the projected image.

In one embodiment, the first DMD 510 includes 1920× 1080 mirrors 550, which represent the number of pixels of a high definition television or flat panel display. The plurality of mirrors 550 in the first DMD 510 may be controlled individually. Each mirror 550 of the plurality of mirrors 550 of the first DMD 510 may be set to an "on" position or an "off" position. When the s-polarization beam 520 reaches the mirrors 550 of the first DMD 510, the mirrors 550 that are set at the "on" position reflect the s-polarization beam 520 back towards the diagonal prism frame 514. The mirrors 550 that are set to the "off" position reflect the s-polarization beam to the light dump 412 rather than back towards the diagonal prism frame 514. The first DMD 510 is configured to reflect the s-polarization beam 520, such that the s-polarization beam 520 passes back through the first quarter phase plate 506. The first quarter phase plate 506 changes the polarization of the s-polarization beam 520 by an additional quarter phase, such that the first quarter phase plate 506 changes the polarization of the s-polarization beam 520 by a total of a half phase. Thus, after the s-polarization beam 520 passes through the quarter phase plate 506 a second time, the s-polarization beam 520 changes polarization to a p'-polarization beam 523. Therefore, rather than passing through the diagonal prism frame 514, the p'-polarization beam 523 reflects off the diagonal prism frame 514 towards the image out opening.

The second quarter phase plate 508 is disposed in one of the openings 516 of the polarizing beam splitting cube 504, for example, an opening adjacent to the first quarter phase plate 506. The p-polarization beam 522 passes through the second quarter phase plate 508. The second quarter phase plate 508 is configured to change the polarization of the p-polarization beam 522 by a quarter phase. The second DMD 512 is disposed opposite the second quarter phase plate 508. The second DMD 512 is constructed similarly to the first DMD 510.

When the p-polarization beam 522 reaches the mirrors 552 of the second DMD 512, the mirrors 552 that are at the "on" position reflect the p-polarization beam 522 back towards the diagonal prism frame 514. The mirrors 552 that are at the "off" position reflect the p-polarization beam to the light dump 412 rather than back towards the diagonal prism frame 514. The second DMD 512 is configured to reflect the p-polarization beam 522, such that the p-polarization beam 522 passes back through the second quarter phase plate 508. The second quarter phase plate 508 changes the polarization of the p-polarization 522 by an additional quarter phase, such that the second quarter phase plate 508 changes the polarization of the p-polarization beam 522 by a total of a half phase. Thus, after the p-polarization beam 522 passes through the quarter phase plate 508 a second time, the p-polarization beam 522 changes polarization to an s'-polarization beam 524. Therefore, rather than reflecting off the diagonal prism frame 514, the s'-polarization beam 524 passes through the diagonal prism frame 514 towards the image out opening, such that a plurality of superimposed images is transmitted from the multiple DMD assembly onto the substrate 140 to expose an underlying layer in areas on the surface of the substrate 140.

The multiple DMD assembly 500 further includes adjustment mechanisms 526, 528 coupled to each DMD 510, 512. The adjustment mechanisms 526, 528 allow the user to adjust the position of the DMDs 510, 512 such that multiple DMD assembly 500 projects an image out that contains a plurality of write beams onto the substrate 140. The plurality of superimposed images forms approximately twice the amount of pixels as that formed by a single DMD because twice the amount of write beams exposes twice the number of areas on the surface of the substrate. In one embodiment, the write beams provided by the multiple DMD assembly 500 may be patterned as an offset grid of write beams. The offset grid of write beams results in twice the amount of pixels formed by the multiple DMD assembly 500. Therefore, the multiple DMD assembly 500 increases resolution while cutting the cost of adding additional image projection devices.

Figure 6:
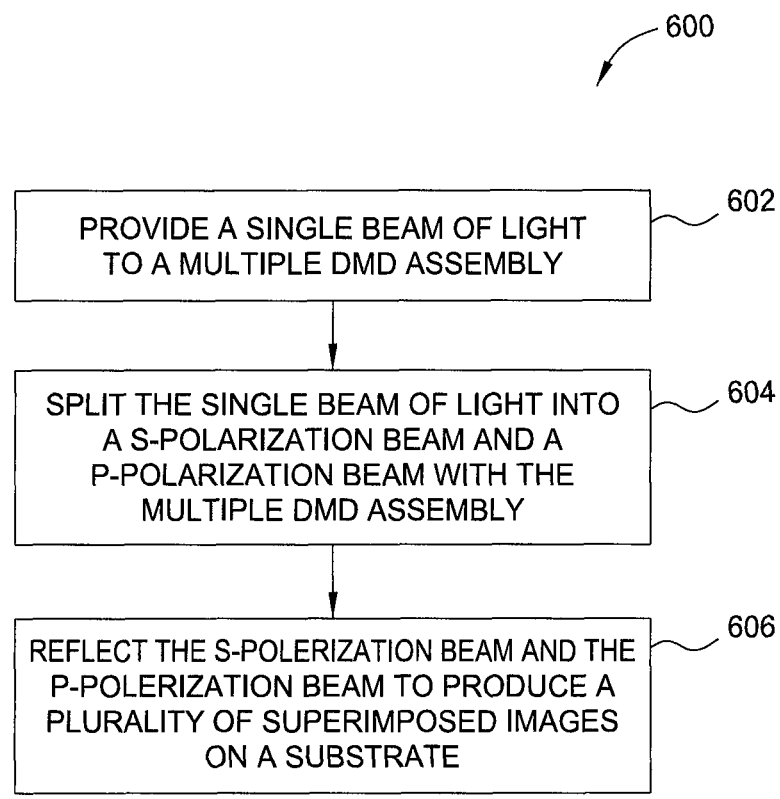
FIG. 6 illustrates a method of producing an image on a substrate using the multiple DMD assembly of FIG. 5, according to one embodiment.

FIG. 6 illustrates a method 600 of producing an image on a substrate using a multiple DMD assembly, such as the DMD assembly 508 of FIG. 5. The method 600 begins at block 602 by providing a single beam of light to the multiple DMD assembly. A light source provides the single beam of light to the multiple DMD assembly. For example, the light source may be the light source 402, which may be capable of producing light having a predetermined wavelength. In one embodiment, the predetermined wavelength is in the blue or near ultraviolet (UV) range, such as less than about 450 nm.

At block 604, the multiple DMD assembly splits the single beam of light into an s-polarization beam and a p-polarization beam. For example, in the multiple DMD assembly 500 shown in FIG. 5, polarizing beam splitting cube 504 splits the single beam of light into an s-polarization beam 520 and a p-polarization beam 522.

At block 606, the multiple DMD assembly reflects the s-polarization beam and the p-polarization beam such that the multiple DMD assembly produces a plurality of superimposed write beams on the substrate. In the multiple DMD assembly 500 shown in FIG. 5, the s-polarization passes through a quarter wave plate and reflects off a first DMD. The reflected s-polarization beam passes through the quarter wave plate a second time, such that the s-polarization beam undergoes a total phase change of a half phase. Thus, the s-polarization beam is now a p'-polarization beam. The reflected p-polarization beam passes through a second quarter wave plate and reflects off a second DMD. Similar to the s-polarization beam, the p-polarization beam passes through the second quarter wave plate twice, such that the p-polarization beam undergoes a total phase change of a half phase. Thus, the p-polarization beam is now an s'-polarization beam. The p'-polarization beam is transmitted through a diagonal prism frame in the polarizing beam splitting cube and the s'-polarization beam is reflected off the diagonal prism frame such that a plurality of superimposed write beams is transmitted from the multiple DMD assembly onto a substrate. The plurality of superimposed write beams exposes an underlying layer in areas of the substrate, such that approximately twice the amount of pixels are formed on the substrate as compared to the number of pixels formed by a single DMD.

Figure 7:
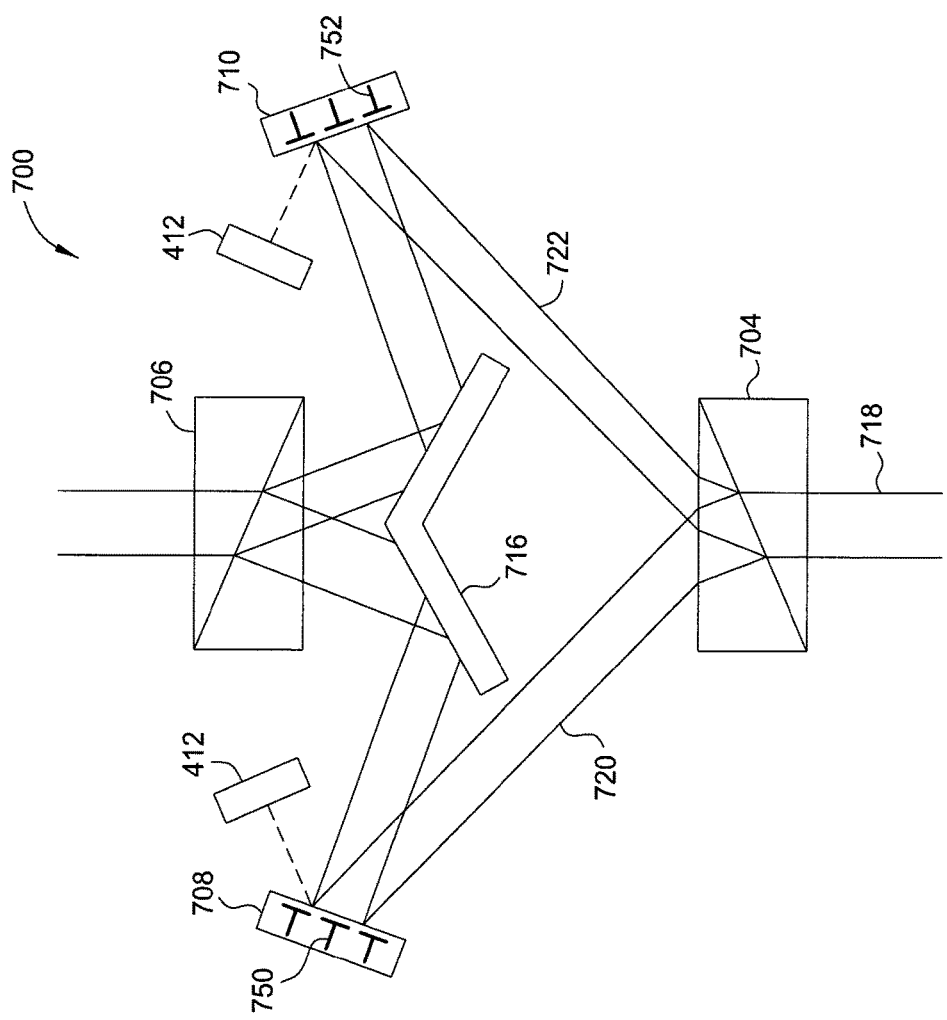
FIG. 7 illustrates another embodiment of a multiple DMD assembly.

FIG. 7 illustrates a multiple DMD assembly 700, according to one embodiment. The multiple DMD assembly 700 may include a first light altering device 704, a second light altering device 706, a plurality of DMDs 708, 710, and a turning mirror 716. The first light altering device 704 is configured to split incoming light 718 from the light source 402 into an s-polarization beam 720 and a p-polarization beam 722. For example, the first light altering device 704 may be a 45° Wollanston prism such that the s-polarization beam 720 and the p-polarization beam 722 diverge from the first light altering device 704 at an angle of about 45 degrees.

The first DMD 708 is positioned relative to the first light altering device 704, such that the s-polarization beam 720 contacts the first DMD 708 after the s-polarization beam 720 diverges from the first light altering device 704. The first DMD 708 includes a plurality of mirrors 750. The number of mirrors 750 may correspond to the resolution of the resolution of the projected image. In one embodiment, the first DMD 708 includes 1920×1080 mirrors, which represent the number of pixels of a high definition television or flat panel display. The plurality of mirrors 750 in the first DMD 708 may be controlled individually. Each mirror 750 of the plurality of mirrors 750 of the first DMD 708 may be at an "on" position or an "off" position. When the s-polarization beam 720 reaches the mirrors 750 of the first DMD 708, the mirrors 750 that are at the "on" position reflect the s-polarization beam 720 back towards the turning mirror 716. The mirrors 750 that are at the "off" position reflect the s-polarization beam 720 to the light dump 412.

The second DMD 710 is positioned opposite the first DMD 708, and relative to the first light altering device 704, such that the p-polarization beam 722 contacts the second DMD 710 when the p-polarization beam 722 diverges from the first light altering device 704. The second DMD 710 is similarly constructed as the first DMD 708.

When the p-polarization beam 722 reaches the second DMD 710, the mirrors 752 that are at the "on" position reflect the p-polarization beam 722 to the turning mirror 716. The mirrors 752 that are at the "off" position reflect the p-polarization beam to the light dump 412.

The turning mirror 716 is configured to reflect the s-polarization beam 720 and the p-polarization beam 722 towards the second light altering device 706. The turning mirror 716 is shaped and positioned such that the s-polarization beam 720 and the p-polarization beam 722 enter the second light altering device 706 at an angle. For example, in one embodiment, the angle may be about 21 degrees.

The second light altering device 706 in configured to change the direction of the incoming s-polarization beam and the p-polarization beam. The multiple DMD assembly 700 projects an image out that includes a plurality of superimposed write beams onto a substrate. The plurality of superimposed write beams exposes the underlying layer in areas on the surface of the substrate 140. Pixels are formed in the exposed areas on the surface of the substrate. The plurality of superimposed write beams results in approximately twice the amount of pixels formed on the surface of the substrate 140 as compared to the number of pixels formed by a single DMD. In one embodiment, the plurality of write beams transmitted by the multiple DMD assembly 700 may be an offset grid of write beams. The offset grid of write beams allows twice the amount of pixels to be formed on the surface of the substrate 140. Therefore, the multiple DMD assembly 700 increases resolution while cutting the cost of adding additional image projection devices.

Figure 8:
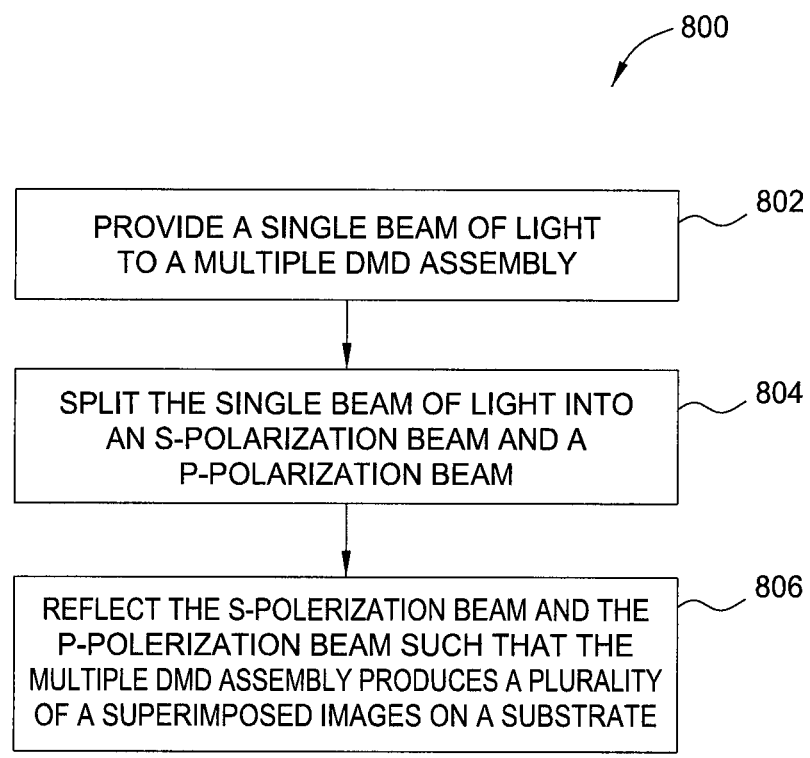
FIG. 8 illustrates a method of producing an image on a substrate using the multiple DMD assembly of FIG. 7.

FIG. 8 illustrates a method 800 of producing an image on a substrate using the multiple DMD assembly of FIG. 7. The method 800 begins at block 802 by providing a single beam of light to the multiple DMD assembly. A light source provides the single beam of light to the multiple DMD assembly. For example, the light source may be light source 402, which may be capable of producing light having a predetermined wavelength. In one embodiment, the predetermined wavelength is in the blue or near ultraviolet (UV) range, such as less than about 450 nm.

At block 804, the multiple DMD assembly splits the single beam of light into an s-polarization beam and a p-polarization beam. For example, in the multiple DMD assembly 700 shown in FIG. 7, the first light altering device 704 splits the single beam of light into an s-polarization beam 720 and a p-polarization beam 722.

At block 806, the multiple DMD assembly reflects the s-polarization beam and the p-polarization beam such that the multiple DMD assembly produces a plurality of superimposed write beams on the substrate. In the multiple DMD assembly 700 shown in FIG. 7, the polarization beams diverge from the first light altering device 704. The s-polarization beam is transmitted to the first DMD assembly. The s-polarization beam reflects off the mirrors of the first DMD assembly. The p-polarization beam is transmitted to the second DMD assembly. The p-polarization beam reflects off the mirrors of the second DMD assembly. The reflected s-polarization beam and the reflected p-polarization beam are transmitted to a turning mirror. The turning mirror reflects the polarization beams at an angle towards a second light altering device. The second light altering device reflects the s-polarization beam and the p-polarization beam such that a plurality of superimposed write beams is transmitted from the multiple DMD assembly. The plurality of superimposed write beams expose the underlying layer in areas on the surface of the substrate such that approximately twice the amount of pixels are formed on the surface of the substrate as compared to the number of pixels formed by a single DMD.

Figure 9:
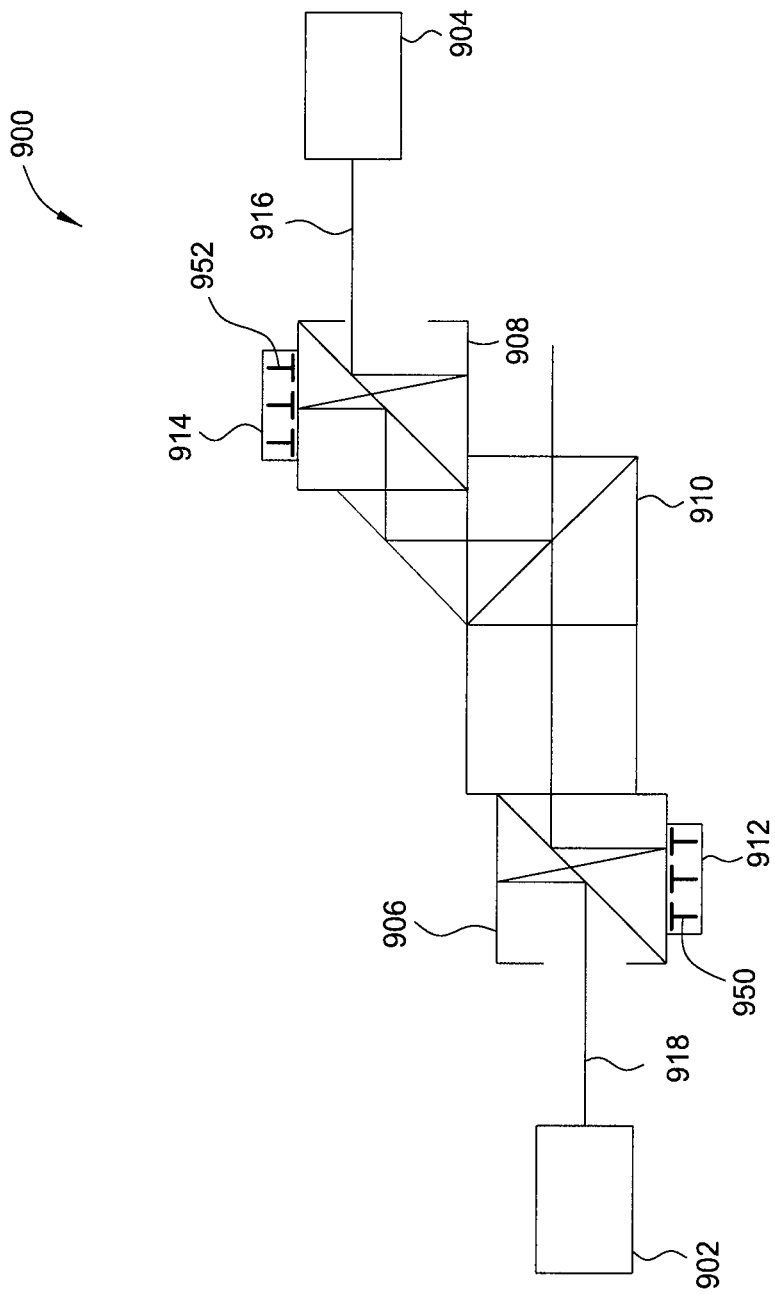
FIG. 9 illustrates an image projection system, according to another embodiment.

FIG. 9 illustrates an image projection system 900, according to one embodiment. The image projection system 900 includes a plurality of light sources 902, 904, a plurality of mirror cubes 906, 908, and a light altering device 910. The first light source 902 is configured to provide a light beam to first mirror cube 906. In the embodiment shown in FIG. 9, the first light source 902 provides a p-polarization beam 916 to the first mirror cube. The first light source 902 may be an LED or a laser. The first light source 902 may be capable of producing a light having a predetermined wavelength. In one embodiment, the predetermined wavelength is in the blue or near UV range, such as less than about 450 nm. The first mirror cube 906 includes a first DMD 912. The first DMD 912 includes a plurality of mirrors 950. The number of mirrors 950 may correspond to the resolution of the resolution of the projected image.

The first DMD 912 includes 1920×1080 mirrors, which represent the number of pixels of a high definition television or flat panel display. The plurality of mirrors 950 in the first DMD 912 may be controlled individually. When the p-polarization beam 916 reaches the mirrors 950 of the first DMD 912, the mirrors 950 that are at an "on" position reflect the p-polarization beam 916 out of the first mirror cube 906 towards the light altering device 910. The mirrors 950 that are at the "off" position reflect the p-polarization beam 916 to a heat sink (not shown). The first DMD 912 is configured to reflect the p-polarization beam 916, such that the p-polarization beam 916 passes out of the first mirror cube 906.

The second light source 904 is configured to provide a light beam to the second mirror cube 908. In the embodiment shown in FIG. 9, the second light source 904 provides an s-polarization beam 918 to the second mirror cube 908. The second light source 904 is similar to the first light source 902. The second mirror cube 908 includes a second DMD 914. The second DMD 914 is similarly constructed as the first DMD 912. When the s-polarization beam 918 reaches the mirrors 952 of the second DMD 914, the mirrors 952 that are at an "on position" reflect the s-polarization beam 918 out of the second mirror cube 908 and towards the light altering device 910. The mirrors 952 that are at the "off" position reflect the s-polarization beam 918 to a heat sink (not shown). The second DMD 914 is configured to reflect the s-polarization beam 918, such that the s-polarization beam 918 passes out of the second mirror cube 908.

The p-polarization beam 916 and the s-polarization beam 918 are transmitted form the respective mirror cubes 906, 908 to the light altering device 910. In one embodiment, the light altering device 910 may be a 50/50 beam splitter. The light altering device 910 is configured to transmit the p-polarization beam through the 50/50 beam splitter. Additionally, the light altering device 910 is configured to reflect the s-polarization beam 918 off the 50/50 beam splitter.

As a result, the image projection system 900 projects an image out that includes a plurality of superimposed write beams onto a substrate. The plurality of superimposed light beams exposes the underlying layer in areas on the surface of the substrate such that approximately twice the amount of pixels are formed on the surface of the substrate as compared to the number of pixels formed by a single DMD. In one embodiment, the plurality of write beams transmitted from the multiple DMD assembly 900 may be an offset grid of light beams. The offset grid of light beams results in twice the amount of pixels formed on the substrate. Therefore, the multiple DMD assembly 900 increases resolution while cutting the cost of adding additional image projection devices.

In the arrangement depicted in FIG. 9, the path lengths for the s-polarization beam and the p-polarization beam are about the same.

Figure 10:
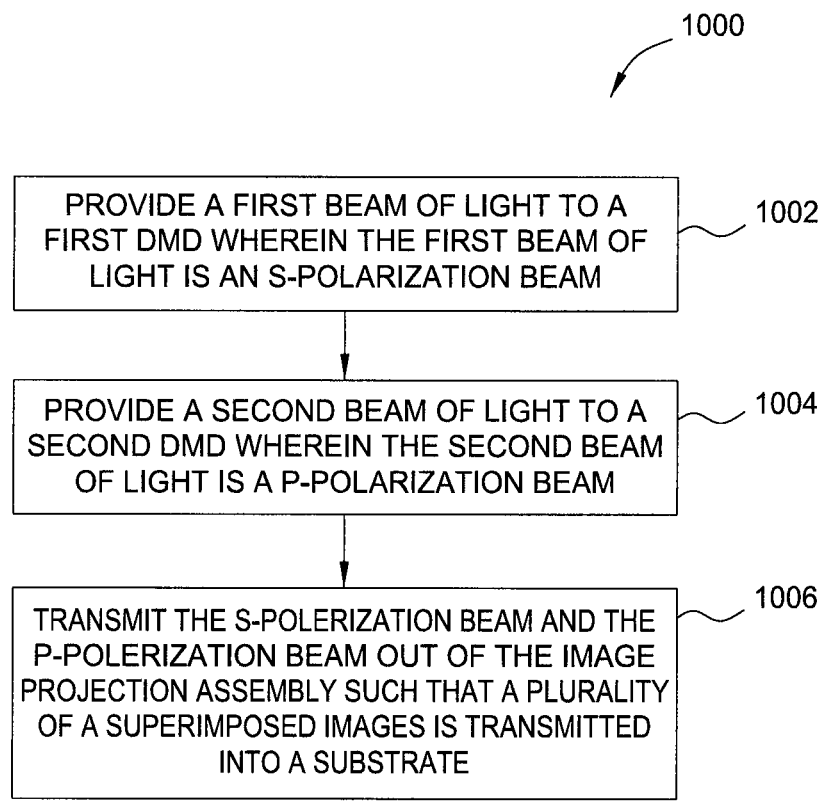
FIG. 10 illustrates a method of producing an image on a substrate using the image projection system of FIG. 9.

FIG. 10 illustrates a method 1000 of producing an image on a substrate using the image projection device of, FIG. 9. The method 1000 begins at block 1002 by providing a first beam of light to a first DMD, wherein the first beam of light is an s-polarization beam.

At block 1004, a second light source provides a second beam of light to a second DMD, wherein the second beam of light is a p-polarization beam. The first DMD reflects the s-polarization beam towards a light altering device. The second DMD reflects the p-polarization beam towards the light altering device.

At block 1006, the light altering device transmits the s-polarization beam and the p-polarization beam out of the image projection device such that a plurality of superimposed write beams is transmitted onto a substrate. In one embodiment, the light altering device may be a 50/50 beam splitter. The p-polarization beam is transmitted through the 50/50 beam splitter and out of the image projection system. The s-polarization beam is reflected off the 50/50 beam splitter and out of the image projection system, such that a plurality of superimposed write beams is transmitted from the image projection device. The plurality of superimposed write beams exposes the underlying layer on areas on the surface of the substrate such that approximately twice the amount of pixels are formed on the surface of the substrate as compared to the number of pixels formed by a single DMD.

While the foregoing is directed to embodiments of the present disclosure, other and further embodiments of the disclosure may be devised without departing from the basic scope thereof, and the scope thereof is determined by the claims that follow.

What is claimed is:

1. An image projection system, comprising:
   at least one light source;
   a multiple digital micromirror device (DMD) assembly configured to project a plurality of superimposed images on a substrate via write beams from the light source, the multiple DMD assembly comprising:
     a plurality of DMDs; and
     a light altering device configured to alter the light provided from the light source, wherein the light altering device is a diagonal prism frame configured to reflect a p-polarization beam and transmit through an s-polarization beam;
   a mirror positioned to reflect the write beams from the light source to the multiple DMD assembly; and
   a light dump adjacent the multiple DMD assembly and configured to receive the s-polarization beam from the multiple DMD assembly.

2. The image projection system of claim 1, wherein the multiple DMD device further comprises:
   a plurality of quarter wave plates configured to alter the s-polarization and p-polarization beams.

3. The image projection system of claim 1, wherein multiple DMD assembly further comprises:
   a second light altering device configured to alter the s-polarization beam and the p-polarization beam.

4. The image projection system of claim 3, wherein the multiple DMD assembly further comprises:

a turning mirror positioned to reflect the s-polarization beam and the p-polarization beam towards the second light altering device.

5. The image projection system of claim 1, wherein the light altering device is a Wollanston prism.

6. The image projection system of claim 1, wherein the plurality of superimposed images exposes an underlying layer on the surface of the substrate.

7. The image projection system of claim 1, wherein exposing the underlying layer on the surface of the substrates forms pixels on the substrate.

8. The image projection system of claim 1, wherein the multiple DMD assembly further comprises a plurality of mirrors positioned to reflect the s-polarization beam to the light dump.

9. The image projection system of claim 1, further comprising a projection lens configured to receive the superimposed images.

10. The image projection system of claim 9, further comprising a camera disposed between the multiple DMD assembly and the projection lens.

11. A method for producing an image on a substrate, comprising:
reflecting a single beam of light from a light source to a multiple DMD assembly;
splitting the single beam of light into an s-polarization beam and a p-polarization beam, wherein the p-polarization beam is reflected from a diagonal prism frame and the s-polarization beam is transmitted through the diagonal prism frame; and
reflecting the s-polarization beam and the p-polarization beam through the multiple DMD assembly such that the multiple DMD assembly produces a plurality of superimposed images on the substrate, wherein the multiple DMD assembly comprises a plurality of mirrors configured to reflect the s-polarization beam or the p-polarization beam towards the diagonal prism frame or towards a light dump.

12. The method of claim 11, further comprising:
altering a phase of the s-polarization beam by a half phase such that the s-polarization beam becomes a p'-polarization beam.

13. The method of claim 12, further comprising:
altering a phase of the p-polarization beam by a half phase such that the p-polarization beam becomes an s'-polarization beam.

14. The method of claim 11, wherein the multiple DMD comprises a plurality of DMDs such that a first DMD reflects the s-polarization beam and a second DMD reflects the p-polarization beam.

15. The method of claim 14, wherein the first DMD reflects the s-polarization beam towards a turning mirror disposed in the multiple DMD assembly, and the second DMD reflects the s-polarization beam towards the turning mirror.

16. The method of claim 14, wherein the turning mirror produces the plurality of superimposed images.

17. The method of claim 14, wherein the plurality of superimposed images exposes an underlying layer on the substrate.

18. The method of claim 11, further comprising:
setting the plurality of mirrors to an on-position; and
reflecting the s-polarization beam or the p-polarization beam towards the diagonal prism frame.

19. The method of claim 11, further comprising:
setting the plurality of mirrors to an off-position; and
reflecting the s-polarization beam or the p-polarization beam towards the light dump.

\* \* \* \* \*